(12) United States Patent
Lee et al.

(10) Patent No.: US 7,342,795 B2
(45) Date of Patent: Mar. 11, 2008

(54) HEAT SINK ASSEMBLY

(75) Inventors: Hsieh-Kun Lee, Tu-Cheng (TW);
Chun-Chi Chen, Tu-Cheng (TW);
Shi-Wen Zhou, Shenzhen (CN); Zhan Wu, Shenzhen (CN)

(73) Assignees: Fu zhun Precision Industry (Shenzhen) Co., Ltd., Bao'an District, Shenzhen, Guangdong Province (CN);
Foxconn Technology Co., Ltd., Tu-Cheng, Taipei Hsien (TW)

( * ) Notice: Subject to any disclaimer, the term of this patent is extended or adjusted under 35 U.S.C. 154(b) by 204 days.

(21) Appl. No.: 11/244,916

(22) Filed: Oct. 5, 2005

(65) Prior Publication Data
US 2006/0262506 A1    Nov. 23, 2006

(30) Foreign Application Priority Data
May 20, 2005    (CN) .................. 2005 2 0058736 U

(51) Int. Cl.
*H05K 7/20* (2006.01)
*F28F 7/00* (2006.01)

(52) U.S. Cl. ............... 361/719; 165/80.3; 165/185; 361/704; 361/710

(58) Field of Classification Search .............. None
See application file for complete search history.

(56) References Cited

U.S. PATENT DOCUMENTS

| 5,384,940 | A |  | 1/1995 | Soule et al. |
|---|---|---|---|---|
| 5,603,374 | A |  | 2/1997 | Wu |
| 5,757,621 | A |  | 5/1998 | Patel |
| 5,901,039 | A |  | 5/1999 | Dehaine et al. |
| 6,404,632 | B1 | * | 6/2002 | Forkas ................ 361/703 |
| 6,549,410 | B1 |  | 4/2003 | Cohen |
| 6,826,054 | B2 |  | 11/2004 | Liu |
| 2004/0184238 | A1 | * | 9/2004 | Yang ................ 361/704 |

* cited by examiner

*Primary Examiner*—Gregory D Thompson
(74) *Attorney, Agent, or Firm*—Morris Manning Martin LLP; Tim Tingkang Xia, Esq.

(57) ABSTRACT

A heat sink assembly includes a heat spreader (10), a plurality of fins (12) extending from the spreader, fasteners (20) and securement sleeves (30) fixed to the fasteners. The fastener includes a head (200) and a shaft (204) having a threaded bottom end (208). The sleeve comprises a cylindrical wall (302), an upper open end (304) and a lower open end (306). The sleeve further has an annular pedestal (308) perpendicularly connected with the wall and extending in the lower open end. The head is received in the wall and contacts the pedestal. The shaft extends through the spreader. A compressed spring (22) is providing between the head and the spreader for urging the spreader downwardly to engage with a heat generating electronic device.

18 Claims, 2 Drawing Sheets

HEAT SINK ASSEMBLY

BACKGROUND

1. Field

The present invention relates generally to a heat sink assembly being mounted on a printed circuit board, and more particularly to fasteners for mounting the heat sink assembly to the printed circuit board.

2. Prior Art

During operation of an electronic component such as a computer central processing unit (CPU), a large amount of heat is often produced. The heat must be quickly removed from the CPU to prevent it from becoming unstable or being damaged. Typically, a heat sink is attached to an outer surface of the CPU to absorb the heat from the CPU. The heat absorbed by the heat sink is then dissipated to ambient air.

Conventionally, a heat sink comprises a heat spreader and a plurality of fins extending from the heat spreader. The heat spreader is fastened on a printed circuit board by extending screws or bolts through holes defined in the printed circuit board. U.S. Pat. No. 5,757,621 shows an example of this kind of heat sink. The screws generally each comprise a head for facilitating an operation of the screw. The head defines a cutout therein to receive a fastening tool, such as a screwdriver. When the heat sink is assembled to the print circuit board, the screw is tightened relative to the printed circuit board by the screwdriver.

However, the actual assembly task of the heat sink is complicated by the greater density of components on the printed circuit board as less room around the heat sink is available to allow assemblers to screw the screws with the fastening tool. The assemblers must gingerly assemble the heat sink on the printed circuit board with the fastening tool. When a force applied to the screws by the fastening tool is diverted from its intended downwardly vertical direction, the screwdriver may slide away from the screw to impact and damage the other components on the printed circuit board.

When components are damaged by the fastening tool, the overall cost of the printed circuit board is increased as oftentimes the damaged components or even the printed circuit board must be replaced.

Hence, there is a need for an apparatus for attaching heat sinks to printed circuit boards in a manner which reduces the likelihood of damage to the components on the printed circuit board or to the printed circuit board and still ensures that the heat sink is properly mounted on the printed circuit board.

SUMMARY

Accordingly, what is needed is an apparatus for fastening a heat sink to a printed circuit board, wherein during operation of the fastening apparatus, risk of a careless separation of a fastening tool from the fastening apparatus to cause damage of other electronic components on the printed circuit board and neighboring the heat sink is prevented.

According to an embodiment of the present invention, a heat sink assembly comprises a heat spreader, a plurality of fins extending from the spreader, fasteners and securement sleeves fixed to the fasteners. The fastener includes a head and a shaft having a threaded bottom end. The sleeve comprises a cylindrical wall, an upper open end and a lower open end. The sleeve forms an annular pedestal perpendicularly connected with the wall and located in the lower open end. The head is received in the wall and contacts the pedestal whereby the wall surrounds the head. The head is configured to be fitted with a fastening tool so that a force applied to the fastening tool drives the fastener to move accordingly. The shaft extends through the spreader. A compressed spring is provided between the head and the spreader for urging the spreader downwardly.

Other advantages and novel features of the present invention will become more apparent from the following detailed description when taken in conjunction with the accompanying drawings, in which:

DETAILED DESCRIPTION OF THE PREFERRED EMBODIMENT

Figure 1:
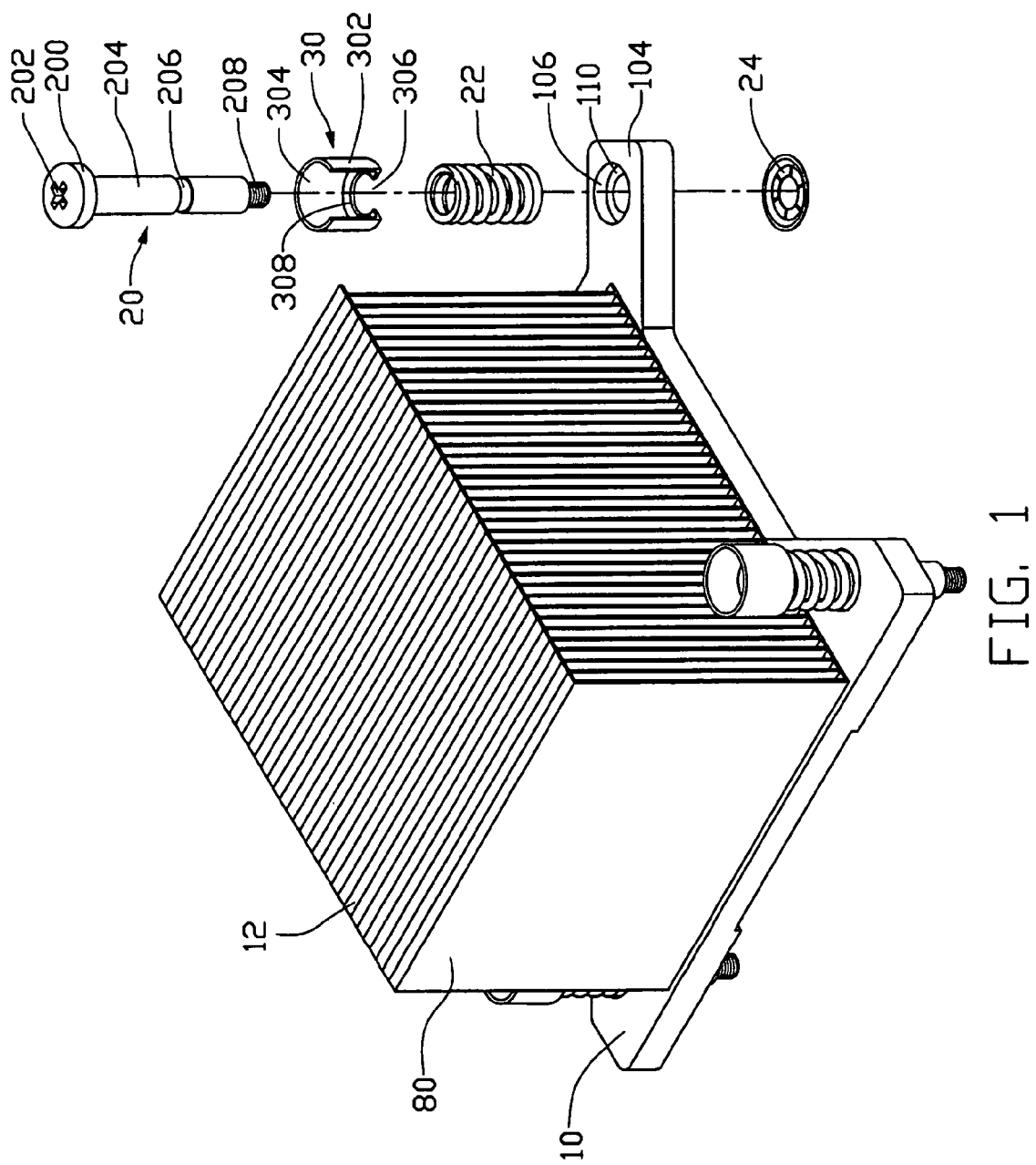
FIG. 1 is a partly exploded view of a heat sink assembly in accordance with one preferred embodiment of the present invention, wherein a part of a securement sleeve of the heat sink assembly is cut away to show an inner structure thereof.

Reference will now be made to the drawing figures to describe a heat sink assembly of a preferred embodiment in accordance with the present invention in detail.

Figure 2:
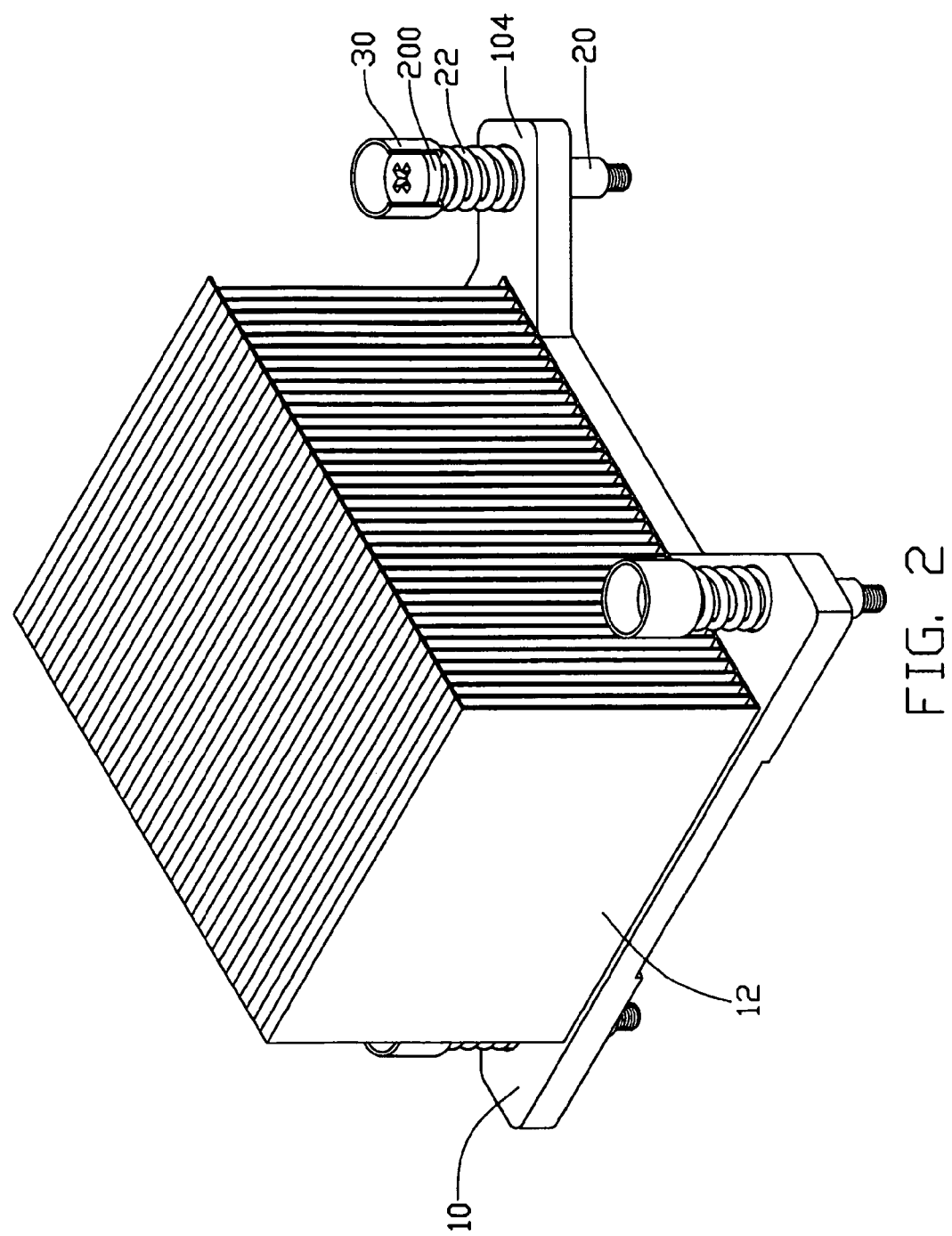
FIG. 2 is an assembled view of FIG. 1.

Referring to FIG. 1 and FIG. 2, the heat sink assembly comprises a heat sink 80, four fasteners 20 (only three being shown) and four securement sleeves 30 (only three being shown) mounted to the fasteners 20, respectively.

The heat sink 80 comprises a heat spreader 10 and a plurality of fins 12 extending from the spreader 10. The spreader 10 is preferably made of copper or aluminum material and has a bottom mating surface (not labeled) for thermally engaging with a heat generating electronic device such as a CPU (not shown) mounted on a printed circuit board (not shown). The heat spreader 10 forms four ears 104 (only three being shown) extending outwardly from four corners (only three being shown) thereof. The heat sink 80 is attached to the CPU by extending the four fasteners 20 through the four ears 104 to threadedly engage with a retainer attached to the printed circuit board. The structure of the retainer is well know by persons skilled in the art and is irrelevant to the features of the present invention; thus, detailed description of the retainer is omitted here. Each ear 104 defines a hole 106, for permitting passage of the fastener 20 therethrough. An annular step portion 110 is formed by the ear 104 in the hole 106, for supporting a spring 22 thereon.

The fastener 20 comprises a circular head 200 having two intersecting perpendicular slots 202 for receiving a screwdriver (not shown). A diameter of the head 200 is larger than that of the hole 106. The fastener 20 forms an elongated shaft 204 extending from the head 200 and terminating with a threaded bottom end 208. The spring 22 is dimensioned to loosely fit around the shaft 204, and contacts the annular step portion 110 when installed, for exerting a spring force downwardly on the ear 104 when the fastener 20 is threadedly fastened to the retainer (not shown). An annular recess 206 is defined in a middle of a circumferential periphery of the shaft 204. An annulus 24 is received in the recess 206 to mount the fastener 20 to the ear 104 of the spreader 10 after the recess 206 of the shaft 204 and the threaded bottom end 208 passing through the hole 106 to reach a position below the ear 104.

The securement sleeve 30 is formed of plastic which is thermally and electrically insulating. The sleeve 30 is hollow and has a wall 302. The wall 302 is cylindrical. The sleeve 30 comprises upper and lower open ends 304, 306, permitting the passage of the shaft 204 and the threaded bottom end 208. The sleeve 30 forms an annular pedestal 308 at the lower open end 306. The annular pedestal 308 is perpendicularly connected with the wall 302 and extends toward the lower open end 306, for supporting the head 200. Thus, the lower open end 306 is smaller than the upper open end 304.

In assembly, the fins 12 are fixed on the heat spreader 10 by soldering. The shaft 204 of each fastener 20 is passed through a corresponding sleeve 30. The head 202 of each fastener 20 is received in the wall 302 and contacts the pedestal 308, whereby the wall 302 surrounds the head 202. The shaft 204 is then extended through the hole 106 of ear 104 of the spreader 104 after the spring 22 is fitted around the shaft 204, such that the spring 22 is compressed between the head 200 and the annular step portion 110. The annulus 24 snaps in the recess 206 of the shaft 204 when the recess 206 reaches the position below the ear 104, whereby the fastener 20, the sleeve 30, the spring 22 and the annuls 24 are assembled to the ear 104 as shown in FIG. 2.

In the preferred embodiment, a tip of the screwdriver is fitted into the slots 202 of the head 200 of the fastener 20. The head 200 is turned by the screwdriver in the sleeve 30 to rotate the fastener 20 such that the threaded bottom end 208 of the fastener 20 threadingly engages with the retainer. To achieve the connection between the threaded bottom end 208 and the retainer, the screwdriver exerts not only the rotation force but also a vertically downward push force on the head 200. In the present invention, the tip of the screwdriver can be easily fitted in the slots 202 by a guidance of the sleeve 30. Furthermore, by a restraint of the sleeve 30, during the rotation and downward movement, the screwdriver will not easily escape from the head 200 by a careless diversion happened to the vertically downward force applied on the screwdriver. Therefore, the sleeve 30 can protect electronic components adjacent to the heat sink assembly on the printed circuit board from being damaged by the screwdriver when the force applied on the screwdriver is diverted from its intended vertically downward direction.

It is believed that the present invention and its advantages will be understood from the foregoing description, and it will be apparent that various changes may be made thereto without departing from the spirit and scope of the invention or sacrificing all of its material advantages, the examples hereinbefore described merely being preferred or exemplary embodiments of the invention.

We claim:

1. A heat sink assembly comprising:
   a heat spreader;
   a plurality of fins extending from the heat spreader;
   a fastener having a head and a shaft extending through the heat spreader, the head being adapted for receiving a rotation force from a fastening tool; and
   a hollow sleeve comprising a cylindrical wall, an upper open end and a lower open end, and an annular pedestal perpendicularly connected with the cylindrical wall and located in the lower open end, wherein the head of the fastener contacts the pedestal of the sleeve and is received in and surrounded by the cylindrical wall of the sleeve.

2. The heat sink assembly of claim 1, wherein the shaft extends downwardly from the head and has a threaded bottom end.

3. The heat sink assembly of claim 2, wherein the shaft passes the sleeve through the upper and lower open ends.

4. The heat sink assembly of claim 2, wherein an annular recess is defined in the shaft, and an annulus is received in the recess after the annular recess of the shaft is passed through the spreader.

5. The heat sink assembly of claim 1, wherein a spring is compressed between the head and the spreader for urging the spreader in a direction away from the head of the fastener.

6. A heat sink assembly comprising:
   a heat sink;
   a fastener having a head and a shaft extending from the head through the heat sink; and
   a hollow sleeve in which the head of the fastener is mounted, the hollow sleeve surrounding the head of the fastener, adapted for receiving a fastening tool to fit with the head of the fastener, the hollow sleeve having an annular pedestal formed at a bottom thereof, the head of the fastener contacting and being located above the pedestal.

7. The heat sink assembly of claim 6, wherein the sleeve comprises a cylindrical wall, an upper open end and a lower open end.

8. The heat sink assembly of claim 7, wherein the shaft passes through the sleeve, and the head is received in the wall.

9. The heat sink assembly of claim 8, wherein the pedestal is perpendicularly connected with the cylindrical wall and located in the lower open end of the sleeve.

10. The heat sink assembly of claim 6, wherein the heat sink comprises a heat spreader and a plurality of fins extending from the heat spreader, a plurality of ears being formed at corners of the heat spreader, each of the ears defining a through hole therein with a step portion formed in the hole.

11. The heat sink assembly of claim 6, wherein an annular recess is defined in the shaft, and an annulus is received in the recess after the annular recess of the shaft is passed through the heat sink.

12. The heat sink assembly of claim 10, wherein a spring is compressed between the head and the step portion of the heat spreader for urging the heat spreader in a direction away from the head.

13. A heat sink assembly comprising:
   a heat sink;
   a fastener adapted for securing the heat sink relative to a printed circuit board so that the heat sink can thermally contact with a heat generating device on the printed circuit board, comprising:
      a head adapted for receiving a rotation force and a push force from a fastening tool;
      a shaft extending downwardly from the head and having a threaded bottom end;
      a sleeve made of plastic surrounding the head, the sleeve comprising:
         a pedestal; and
         a cylindrical wall extending upwardly from the pedestal, the head being located above and contacting the pedestal and being totally surrounded by the cylindrical wall, whereby the fastening tool will not easily escape from the head when the fastening tool applies the rotation and push forces to the head.

14. The heat sink assembly of claim 13, wherein the heat sink has a heat spreader adapted for thermally contacting with the heat generating electronic device, fins extending upwardly from the heat spreader and an ear extending outwardly from the heat spreader, the shaft of the fastener being extended through the ear to reach a position in which the threaded bottom end is located below the ear and the head and the sleeve are located above the ear.

15. The heat sink assembly of claim 14, wherein the sleeve has an upper open end and a lower open end, the pedestal extending perpendicularly from the cylindrical wall in the lower open end.

16. The heat sink assembly of claim 15, further comprising a spring surrounding the shaft and compressed between the ear and the head of the fastener.

17. The heat sink assembly of claim 16 further comprising an annulus and wherein the shaft defines a recess in a circumferential periphery thereof, the annulus snapping in the annulus at a location below the ear.

18. The heat sink assembly of claim 13 further comprising an annulus and wherein the shaft defines a recess in a circumferential periphery thereof, the annulus snapping in the annulus at a location below the heat sink.

* * * * *